(12) United States Patent
Colvin et al.

(10) Patent No.: US 9,978,555 B2
(45) Date of Patent: May 22, 2018

(54) ION SOURCE LINER HAVING A LIP FOR ION IMPLANTATION SYSTEMS

(71) Applicant: Axcelis Technologies, Inc., Beverly, MA (US)

(72) Inventors: Neil K. Colvin, Merrimack, NH (US); Tseh-Jen Hsieh, Rowley, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days. days.

(21) Appl. No.: 15/344,502

(22) Filed: Nov. 4, 2016

(65) Prior Publication Data

US 2017/0133193 A1 May 11, 2017

Related U.S. Application Data

(60) Provisional application No. 62/251,523, filed on Nov. 5, 2015.

(51) Int. Cl.
*H01J 37/08* (2006.01)
*H01J 37/317* (2006.01)
*H01J 27/02* (2006.01)

(52) U.S. Cl.
CPC ............ *H01J 37/08* (2013.01); *H01J 27/022* (2013.01); *H01J 37/3171* (2013.01); *H01J 2237/31705* (2013.01)

(58) Field of Classification Search
CPC .......... H01J 27/02; H01J 27/024; H01J 27/08; H01J 27/16; H01J 37/08; H01J 37/3171;
(Continued)

(56) References Cited

U.S. PATENT DOCUMENTS 5,262,652 A * 11/1993 Bright ................... H01J 27/022
250/423 R
5,497,006 A 3/1996 Sferiazzo et al.
(Continued)

FOREIGN PATENT DOCUMENTS

JP 2010073387 A 4/2010

OTHER PUBLICATIONS

PCT International Search Report dated Jun. 7, 2017 for application No. PCT/US2017/025845.
(Continued)

*Primary Examiner* — David E Smith
(74) *Attorney, Agent, or Firm* — Eschweiler & Potashnik, LLC (57) ABSTRACT

An ion source has an arc chamber having a body defining and interior region. A liner defined an exposure surface of the interior region that is exposed to a plasma generated within the arc chamber. An electrode has a shaft with a first diameter that passes through the body and the liner. The electrode is electrically isolated from the body where the liner is a plate having a first surface with an optional recess having a second surface. A hole is defined through the recess for the shaft to pass through. The hole has a second diameter that is larger than the first diameter, and an annular gap exists between the plate and the shaft. The plate has a lip extending from the second surface toward the first surface that surrounds the hole within the recess and generally prevents particulate contaminants from entering the annular gap.

20 Claims, 6 Drawing Sheets

(58) Field of Classification Search
CPC ....... H01J 37/31705; H01J 2237/31705; H01J 37/3177
See application file for complete search history.

(56) References Cited

U.S. PATENT DOCUMENTS

| | | |
|---|---|---|
| 6,501,078 B1 | 12/2002 | Ryding et al. |
| 7,033,444 B1 | 4/2006 | Komino |
| 9,006,690 B2 | 4/2015 | Colvin et al. |
| 2005/0229849 A1 | 10/2005 | Silvetti |
| 2006/0030134 A1 | 2/2006 | Kim et al. |
| 2008/0230713 A1* | 9/2008 | Huang .................... H01J 27/08 250/426 |
| 2009/0008570 A1* | 1/2009 | Chen ...................... H01J 27/14 250/426 |
| 2011/0156570 A1* | 6/2011 | Jerez ...................... H01J 27/08 313/275 |
| 2011/0240889 A1 | 10/2011 | Colvin et al. |
| 2012/0013249 A1 | 1/2012 | Jerez |
| 2014/0319994 A1 | 10/2014 | Colvin |
| 2015/0179393 A1 | 6/2015 | Colvin et al. |
| 2015/0270100 A1 | 9/2015 | Jerez et al. |

OTHER PUBLICATIONS

International Search Report and the Written Opinion of the International Searching Authority, Dated Feb. 21, 2017 for PCT/US2016/060570.

Notice of Allowance dated Dec. 11, 2017 in connection with U.S. Appl. No. 15/410,711.

Non-Final Office Action dated Mar. 8, 2018 in connection with U.S. Appl. No. 15/477,680.

* cited by examiner

ION SOURCE LINER HAVING A LIP FOR ION IMPLANTATION SYSTEMS

REFERENCE TO RELATED APPLICATIONS

This application claims the benefit of U.S. Provisional Application No. 62/251,523 filed Nov. 5, 2015, entitled "ION SOURCE LINER HAVING A LIP FOR ION IMPLANTATION SYSTEMS", the contents of which are herein incorporated by reference in their entirety.

FIELD

The present invention relates generally to ion implantation systems, and more specifically to a liner for an ion source arc chamber.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Batch-type ion implanters are well known, which typically include a spinning disk support for moving multiple silicon wafers through the ion beam. The ion beam impacts the wafer surface as the support rotates the wafers through the ion beam. Serial-type ion implanters are also known, which treat one wafer at a time. The wafers are supported in a cassette and are withdrawn one at time and placed onto a wafer support. The wafer is then oriented in an implantation orientation so that the ion beam strikes the single wafer. These serial implanters use beam shaping electronics to deflect the beam from its initial trajectory and often are used in conjunction with coordinated wafer support movements to selectively dope or treat the entire wafer surface. As wafers are processes through an ion implantation system they are transferred between specialized processing chambers and wafer input/output stations. Robots are routinely used to transfer wafers in to and out of the processing chamber.

SUMMARY

The present disclosure thus provides a system and apparatus for increasing the lifetime of an ion source. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one aspect of the disclosure, an ion source is provided, such as an ion source for an ion implantation system or various other processing systems. The ion source, for example, comprises an arc chamber having a body defining and interior region of the arc chamber. One or more liners, for example, are operably coupled to the body of the arc chamber, wherein the one or more liners generally define an exposure surface of the interior region of the arc chamber. The exposure surface, for example, is configured to be exposed to, and at least partially confine, a plasma generated within the interior region of the arc chamber.

In one example, an electrode such as a repeller is further provided, wherein the electrode comprises a shaft having a first diameter. The shaft passes through the body and one of the one or more liners, wherein the electrode is electrically isolated from the body. In one example, the said one of the one or more liners comprises a plate having a first surface with a recess having a second surface defined in the recess. A hole is further defined through the recess, wherein the hole is configured to pass the shaft therethrough. The hole, for example, has a second diameter that is larger than the first diameter, therein defining an annular gap between the plate and the shaft. Further, the plate comprises a lip extending from the second surface toward the first surface, wherein the lip surrounds the hole within the recess and generally prevents particulate contaminants from entering the gap. In another example, the recess is absent, whereby the lip extends outwardly from the first surface.

In accordance with one example, the second surface is recessed a first distance from the first surface, wherein the lip extends a second distance from the second surface toward the first surface. One or more of the first surface and second surface may be generally planar. In one particular non-limiting example, the first distance is approximately twice the second distance. In another example, the lip comprises a third surface that is adjacent to a circumference of the hole. The third surface may also be generally planar, but various other configurations are also contemplated, such as rounded or faceted surfaces. The recess, in one example, is generally u-shaped when viewed along an axis of the hole.

In yet another example, the plate defines a bottom surface of the interior region of the arc chamber, wherein the lip generally prevents gravity from allowing particulate contaminants to enter the gap.

In still another example, the lip has a third diameter associated therewith. The electrode may comprise a repeller having a head exposed to the plasma generated within the interior region of the arc chamber, wherein a head has a fourth diameter. In one example, the fourth diameter is greater than the third diameter.

According to various other examples, an ion source chamber is provided having an electrode comprising a shaft and a head. A liner is further provided for the ion source chamber, wherein the liner has a hole therethrough, and wherein the electrode passes through the hole and defines an annular gap between the shaft and the hole. The liner, for example, further comprises a recess with a lip extending from the recess to generally surround the hole and to generally prevent particulate contamination from passing through the hole.

In another example, the electrode comprises a repeller apparatus, wherein the repeller apparatus comprises a repeller electrode operably coupled the shaft. A diameter of the repeller electrode, for example, is larger than a diameter of the hole, and wherein a diameter of the shaft is less than the diameter of the hole. In a further example, a diameter of the lip is between a diameter of the repeller electrode and the diameter of the hole.

Accordingly, the following description and annexed drawings set forth in detail certain illustrative aspects and implementations of the invention. These are indicative of but a few of the various ways in which the principles of the invention may be employed.

DETAILED DESCRIPTION OF THE INVENTION

The present invention is directed generally toward a system, apparatus, and method for decreasing maintenance and improving productivity of an ion source by having an ion source liner with a raised lip. Accordingly, the present invention will now be described with reference to the drawings, wherein like reference numerals may be used to refer to like elements throughout. It should be understood that the description of these aspects are merely illustrative and that they should not be interpreted in a limiting sense.

In the following description, for purposes of explanation, numerous specific details are set forth in order to provide a thorough understanding of the present invention. It will be evident to one skilled in the art, however, that the present invention may be practiced without these specific details.

Ion sources (commonly referred to as arc ion sources) generate ion beams used in implanters and can include heated filament cathodes for creating ions that are shaped into an appropriate ion beam for wafer treatment. U.S. Pat. No. 5,497,006 to Sferlazzo et al., for example, discloses an ion source having a cathode supported by a base and positioned with respect to a gas confinement chamber for ejecting ionizing electrons into the gas confinement chamber. The cathode of the Sferlazzo et al. is a tubular conductive body having an endcap that partially extends into the gas confinement chamber. A filament is supported within the tubular body and emits electrons that heat the endcap through electron bombardment, thereby thermionically emitting ionizing electrons into the gas confinement chamber.

Extraction electrodes, such as those as disclosed in U.S. Pat. No. 6,501,078 to Ryding et al., for example, are generally used in conjunction with an ion source to extract a beam of ions therefrom, wherein ions formed in the confinement chamber are extracted through an exit aperture in a front face of the ion source. The front face of the ion source forms a first apertured source electrode at the potential of the ion source. The extraction electrodes typically include an apertured suppression electrode and an apertured ground electrode aligned with the first apertured source electrode (sometimes referred to as an extraction electrode) to allow the ion beam emerging from the ion source to pass therethough. Preferably, each aperture has an elongated slot configuration. Ceramic insulators are typically mounted between the suppression and ground electrodes for electrically isolating the two electrodes. The ground electrode restricts the propagation of electric fields between the ground electrode and the ion source into the region downstream of the ground electrode. The suppression electrode is biased by a voltage supply to a negative potential relative to ground, and operates to prevent electrons in the ion beam downstream of the ground electrode from being drawn into the extraction region and into the ion source.

An exemplary system for electrode voltage modulation in an ion source extraction electrode apparatus is described in commonly-owned U.S. Pat. No. 9,006,690 to Colvin et al., and a method for reducing particle contamination in an ion implantation system is described in commonly-owned U.S. Patent Application Publication No. 2011/0240889 to Colvin et al., whereby the contents of each are incorporated by reference in their entirety in the present disclosure.

The present disclosure provides an apparatus configured to increase utilization and decrease downtime of an ion source chamber of in an ion implanter. However, it shall be understood that the apparatus of the present disclosure may be also implemented in other semiconductor processing equipment such as CVD, PVD, MOCVD, etching equipment, and various other semiconductor processing equipment, and all such implementations are contemplated as falling within the scope of the present disclosure. The apparatus of the present disclosure advantageously increases the length of usage of the source chamber between preventive maintenance cycles, and thus increases overall productivity and lifetime of the system.

An ion source (also called an ion source chamber) may be used in an ion implantation system, and can be constructed using refractory metals (W, Mo, Ta, etc.) and graphite in order to provide suitable high temperature performance, whereby such materials are generally accepted by semiconductor chip manufacturers. An ion source gas is used within the ion source chamber, wherein the ion source gas may or may not be conductive in nature. However, once the ion source gas is cracked or fragmented, the ionized gas byproduct can be very corrosive.

One example of an ion source gas is boron tri-fluoride ($BF_3$), which can be used as a source gas to generate Boron-11 or $BF_2$ ion beams in an ion implantation system. During ionization of the $BF_3$ molecule, three free fluorine radicals are generated. Refractory metals, such as molybdenum and tungsten, can be used to construct or line the ion arc source chamber in order to sustain its structural integrity at an operating temperature of around approximately 700° C. However, refractory fluoride compounds are volatile and have very high vapor pressures even at room temperature. The fluorine radicals formed within the ion source chamber attack the tungsten metal (molybdenum or graphite) and form tungsten hexafluoride ($WF_6$) (molybdenum or carbon fluoride):

$$WF_6 \rightarrow W^+ + 6F^- \quad (1)$$

or $$(MoF_6 \rightarrow Mo^+ + 6F^-) \quad (2)$$

Tungsten hexafluoride will typically decompose on hot surfaces. For example, in an ion source 100 illustrated in FIG. 1, the tungsten hexafluoride or other resultant material may decompose on surfaces 102 of various internal components 103 of the ion source, such as on surfaces of a cathode 104, a repeller 106 and arc slit optics (not shown) associated an arc chamber 108 of the ion source. This is called a halogen cycle as shown in equation (1), but the resultant material can also precipitate and/or condense back onto walls 110 or liners 112 of the arc chamber 108, as well as the arc slit in the form of a contaminant material 114 (e.g., solid-state particulate contaminants). The liners 112, for example, comprise replaceable members 115 operably coupled to a body 116 of the arc chamber 108, wherein the liners are comprised of graphite or various other materials. The replaceable members 115, for example, provide wear surfaces that can be easily replaced after a period of operation of the arc chamber 108.

Figure 1:
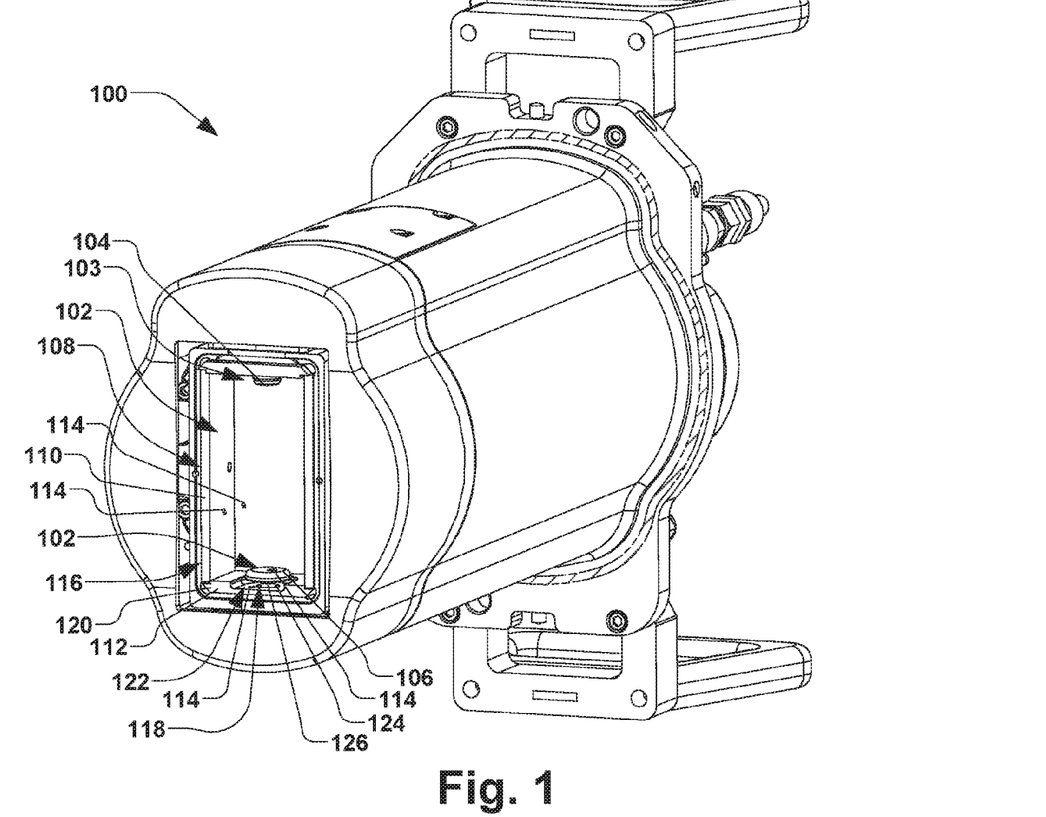
FIG. 1 illustrates a perspective view of an exemplary ion source and arc chamber having a liner.

Another source of contaminant material 114 deposited onto the internal components 103 arises from the cathode 104 when the cathode is indirectly heated (e.g., a cathode composed of tungsten or tantalum), whereby the indirectly heated cathode is used to start and sustain the ion source plasma (e.g., a thermionic electron emission). The indirectly heated cathode 104 and the repeller 106 (e.g., an anti-cathode), for example, are at a negative potential in relation to the body 116 of the arc chamber 108, and both the cathode and repeller can be sputtered by the ionized gases. The repeller 106, for example, can be constructed from tungsten, molybdenum, or graphite. Yet another source of contaminant material 114 deposited on the internal components 103 of the arc chamber 108 is the dopant material (not shown), itself. Over time, these deposited films of contaminant material 114 can become stressed and subsequently delaminate, thereby shortening the life of the ion source 100.

Surface condition plays a significant role between a substrate and films deposited thereon. London dispersion force, for example, describes the weak interaction between transient dipoles or multi-poles associated with different parts of matter, accounting for a major part of the attractive van der Waals force. These results have significant implications in developing a better understanding of atomic and molecular adsorption on different metal substrates. Multi-scale modeling integrating first-principles calculations with kinetic rate equation analysis shows a drastic reduction in the growth temperature from 1000° C. to 250-300° C.

As the formation of a strong atomic bond within the interfacial region is unlikely to happen, the thermal expansion coefficient differences between the substrate (e.g., the cathode 104, liners 112, and/or repeller 106) and the deposited contaminant material 114, the thermal cycling when transitioning between high power and low power ion beams, and the dissociation of implant materials residing within the uneven plasma boundary can cause premature failure. The residual stresses in these deposits are of two types: one arises from imperfections during film growth; the other is due to mismatch in the coefficients of thermal expansion between substrate and the deposited film.

As the film thickness of the contaminant material 114 increases, tensile and/or compressive stresses will reach threshold levels at the interface with the substrate, and peeling or delamination can occur within the ion source 100. When such delamination of the contaminant material 114 occurs, the now-delaminated contaminant material can fall and pass through a gap 118 defined between the repeller 106 and the liner 112 of the body 116 of arc chamber 108, as illustrated in the partially enlarged view 119 of FIG. 2, where the gap electrically decouples the electrically biased repeller from the body of the arc chamber.

Figure 2:
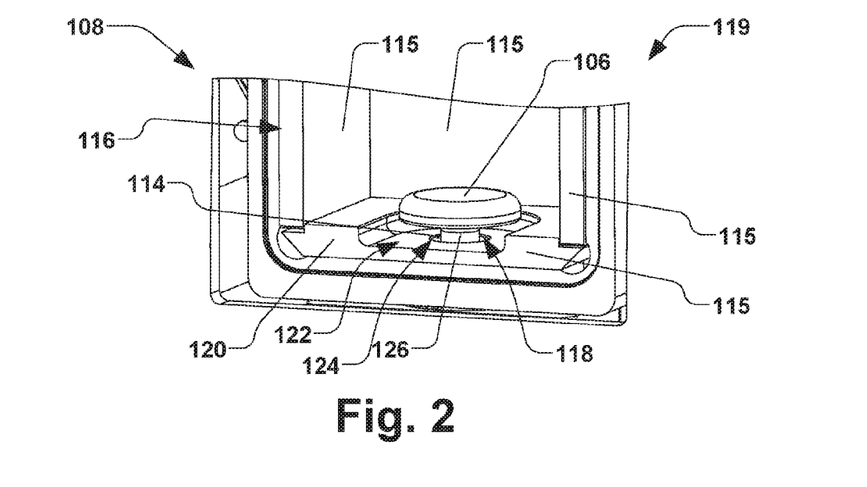
FIG. 2 is a blown-up portion of FIG. 1 showing the arc chamber having a liner without a raised lip.
Figure 3:
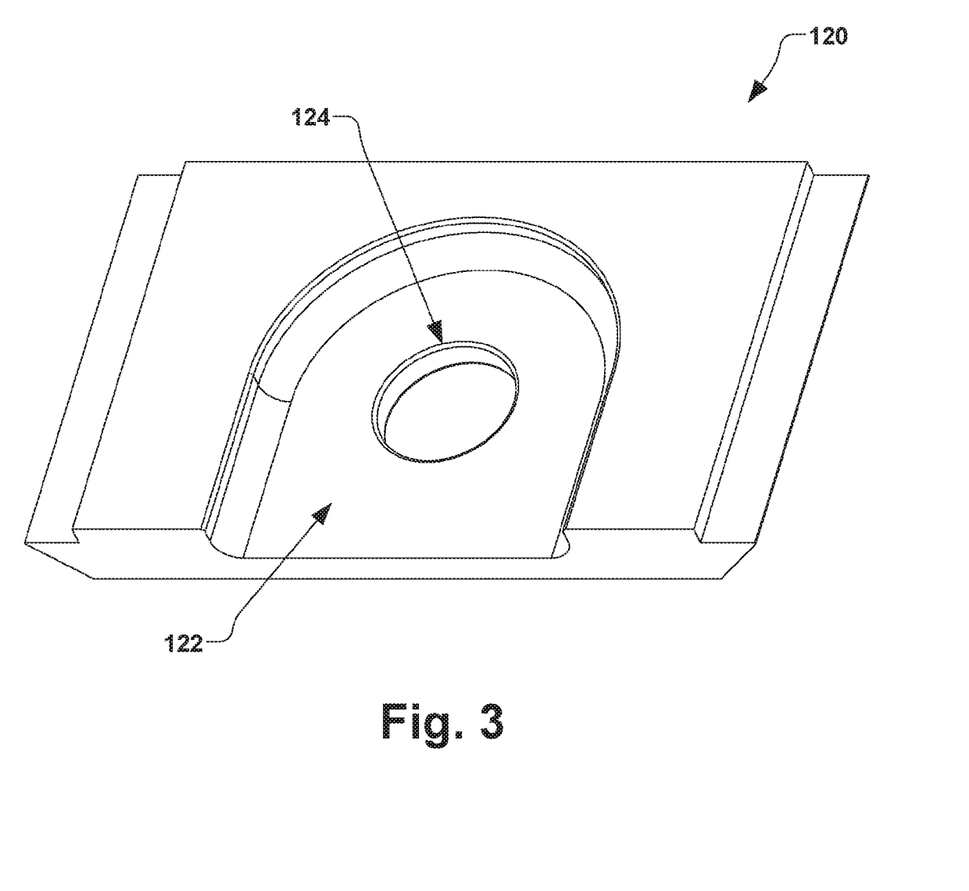
FIG. 3 illustrates a perspective view of an exemplary ion source liner.

FIG. 3 illustrates a bottom liner 120 that is provided in the ion source 100 of FIGS. 1 and 2, whereby the bottom liner comprises a recess 122 and a hole 124, and wherein the hole is configured to accept a shaft 126 of the repeller 106 of FIGS. 1 and 2. As such, the requisite gap 118 is provided between the shaft and bottom liner 120. It is noted, however, that the recess 122 is generally planar in order to accommodate the repeller 106 in the bottom liner 120 of FIG. 3. As illustrated in FIGS. 1 and 2, a head 128 of the repeller 106 masks a line of sight to the gap 118 between the shaft 126 of the repeller and the body 116 of arc chamber 108. However, small particles of contaminant material 114 can still fall into the recess 122 and subsequently enter the gap 116 between the shaft 126 and bottom liner 120. Such contaminant material 114, being electrically conductive and disposed in the gap 118, may electrically short the biased repeller 106 to the body 116 of arc chamber 108, thus causing an unscheduled maintenance and or plasma instabilities, which in turn affect the quality of the ion beam formed therefrom.

Figure 4:
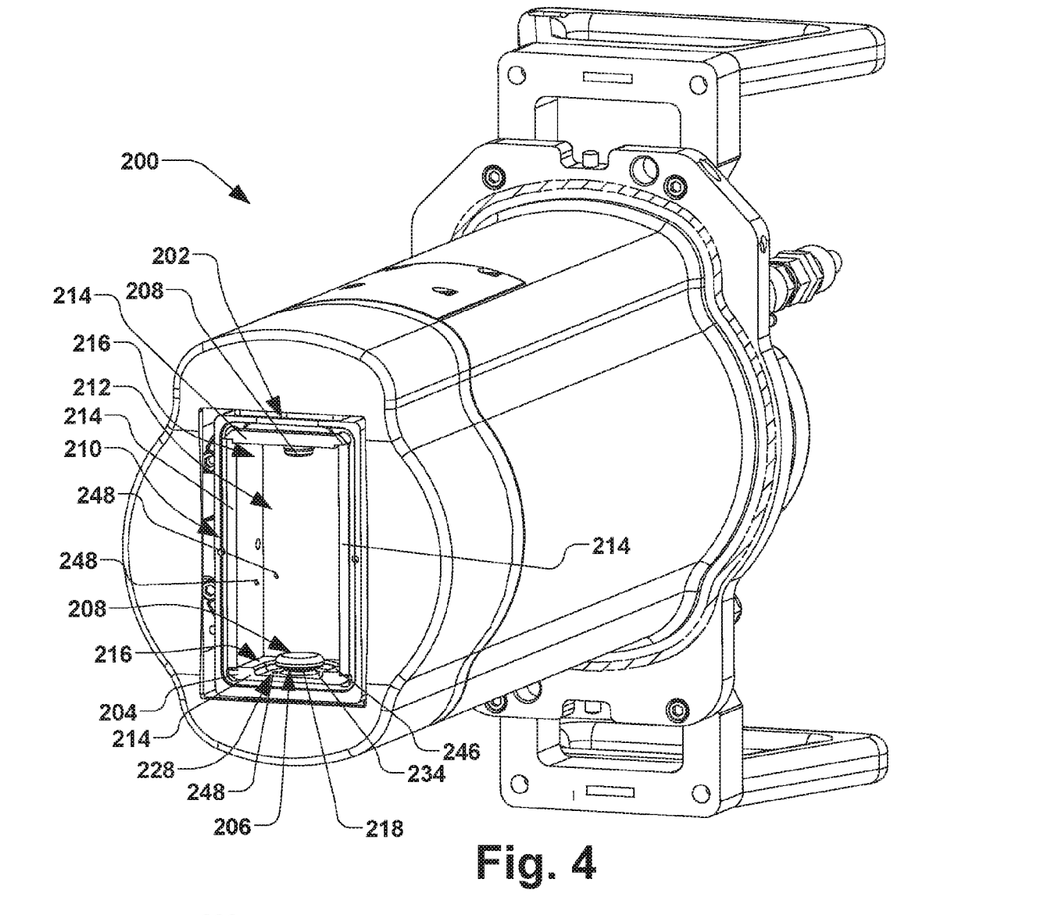
FIG. 4 illustrates a perspective view of an ion source and arc chamber having a liner with a raised lip in accordance with several examples of the present disclosure.
Figure 5:
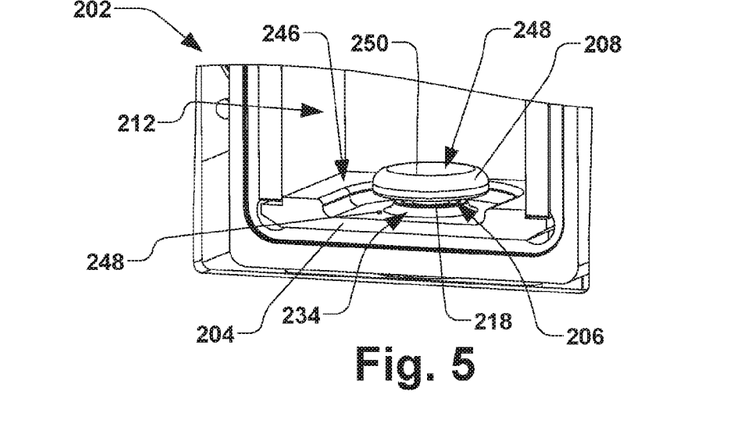
FIG. 5 is a blown-up portion of FIG. 4 showing the arc chamber having a liner with a raised lip in accordance with several examples of the present disclosure.

Accordingly, FIGS. 4 and 5 illustrate an ion source 200 of the present disclosure having a degree of similar structure and components to that of the ion source 100 of FIGS. 1 and 2; however, the ion source 200 of FIGS. 4 and 5 comprises an exemplary arc chamber 202 having a bottom liner 204 configured to substantially prevent such contaminant material from entering into an annular gap 206 between an electrode 208 and the bottom liner of the arc chamber, thus generally preventing premature failure of the ion source.

In accordance with one exemplary aspect, a body 210 of the arc chamber 202 generally defines and interior region 212 of the arc chamber. Further, one or more liners 214 are operably coupled to the body 210 of the arc chamber 202, wherein the one or more liners generally define an exposure surface 216 of the interior region 212 of the arc chamber. For example, the one or more liners 214 comprise at least the bottom liner 204. It should be noted that while the term "bottom" is presently used in reference to the bottom liner 204, the bottom liner need not be positioned at a lower-most position of the arc chamber 202. The exposure surface 216, for example, is configured to be exposed to, and at least partially confine, a plasma (not shown) generated within the interior region 212 of the arc chamber 202.

Figure 6:
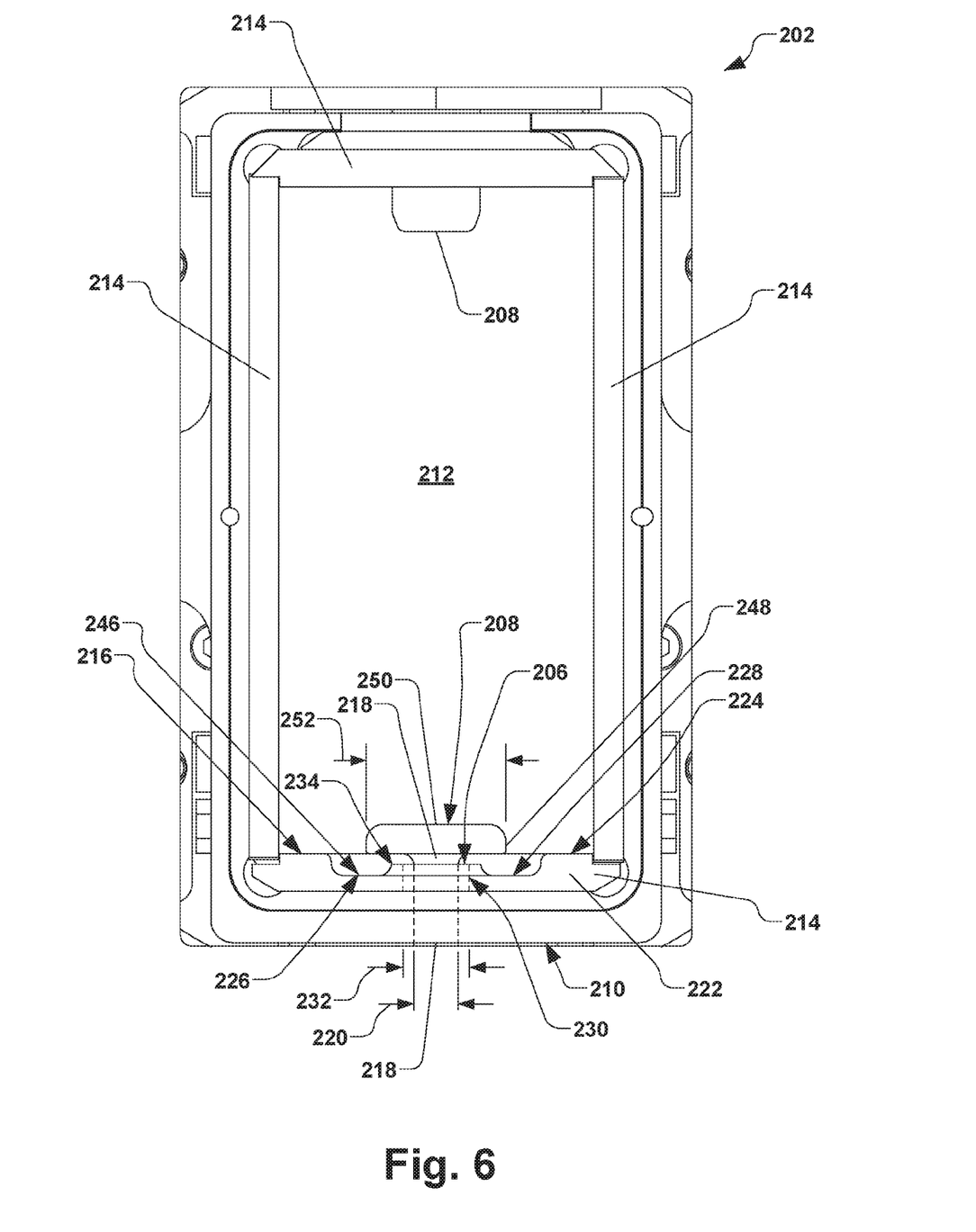
FIG. 6 is a plan view of an arc chamber for an exemplary ion source having a liner with a raised lip in accordance with several examples of the present disclosure.
Figure 8:
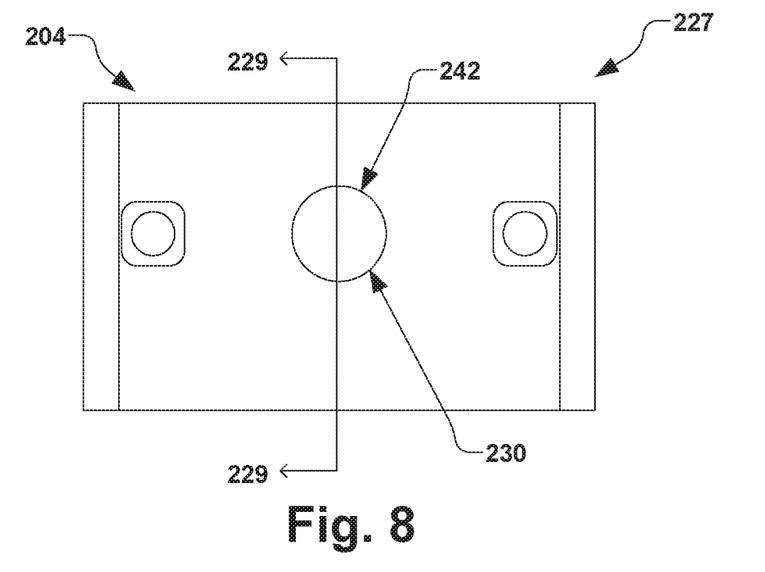
FIG. 8 illustrates a bottom plan view of an exemplary ion source liner in accordance with several examples of the present disclosure.
Figure 9:
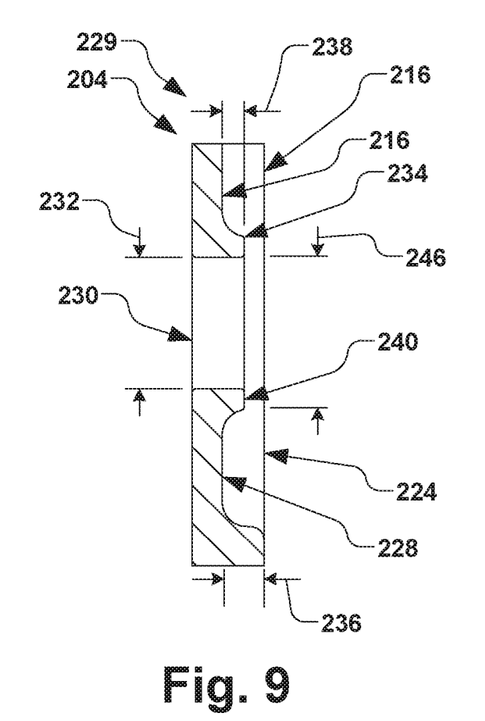
FIG. 9 illustrates a cross-sectional view of FIG. 8 showing the ion source liner with a raised lip in accordance with several examples of the present disclosure.

According to one example, the electrode 208 comprises a shaft 218 having a first diameter 220 illustrated in FIG. 6, wherein the shaft passes through the body 210 and the bottom liner 204. The electrode 208 is electrically isolated from the body 210, as will be discussed infra, wherein the bottom liner 204 comprises a plate 222 having a first surface 224 with a recess 226 defined therein. The recess 226, for example, has a second surface 228 defined therein, wherein a hole 230 is further defined through the recess, as illustrated in greater detail in FIGS. 6 and 8. FIG. 8 illustrates a bottom view 227 of the bottom liner 204, while FIG. 9 illustrates section 229 of the bottom liner, where the hole 230, for example, is configured to pass the shaft 218 of the electrode 208 of FIGS. 4-5 therethrough. The hole 230 has a second diameter 232 that is larger than the first diameter 220 of the shaft 218 of FIG. 6. Accordingly, the annular gap 206 is defined between the plate 222 and the shaft 218, thereby electrically isolating the shaft from the bottom liner 204.

In accordance with the present disclosure, the plate 222 further comprises a lip 234 extending from the second surface 228 toward the first surface 224. As such, the lip 234 generally surrounds the hole 230 within the recess 226 in the bottom liner 204, while leaving the annular gap 204 between the plate 222 and the shaft 218 of the electrode 208 for electrical isolation therebetween. Accordingly, the lip 234 generally prevents particulate contaminants from entering the annular gap 206 due to gravitational forces, thus preventing electrical short circuiting between the electrode 208 and the body 210 and bottom liner 204 of the arch chamber 202.

According to one example, as illustrated in FIG. 9, the second surface 228 is recessed a first distance 236 from the first surface 224. In the present example, the lip 234 extends a second distance 238 from the second surface 228 toward the first surface 224. In the present example, the first distance 236 is approximately twice the second distance 238, but such distances can vary based on design of the electrode 208 of FIGS. 5-6 or other design criteria. As illustrated in FIG. 9, one or more of the first surface 224 and second surface 228 is generally planar. However, while not shown, one or more of the first surface 224 and second surface 228 may be sloped or have a curvilinear profile, and all such profiles are contemplated as falling within the scope of the present disclosure.

Figure 7:
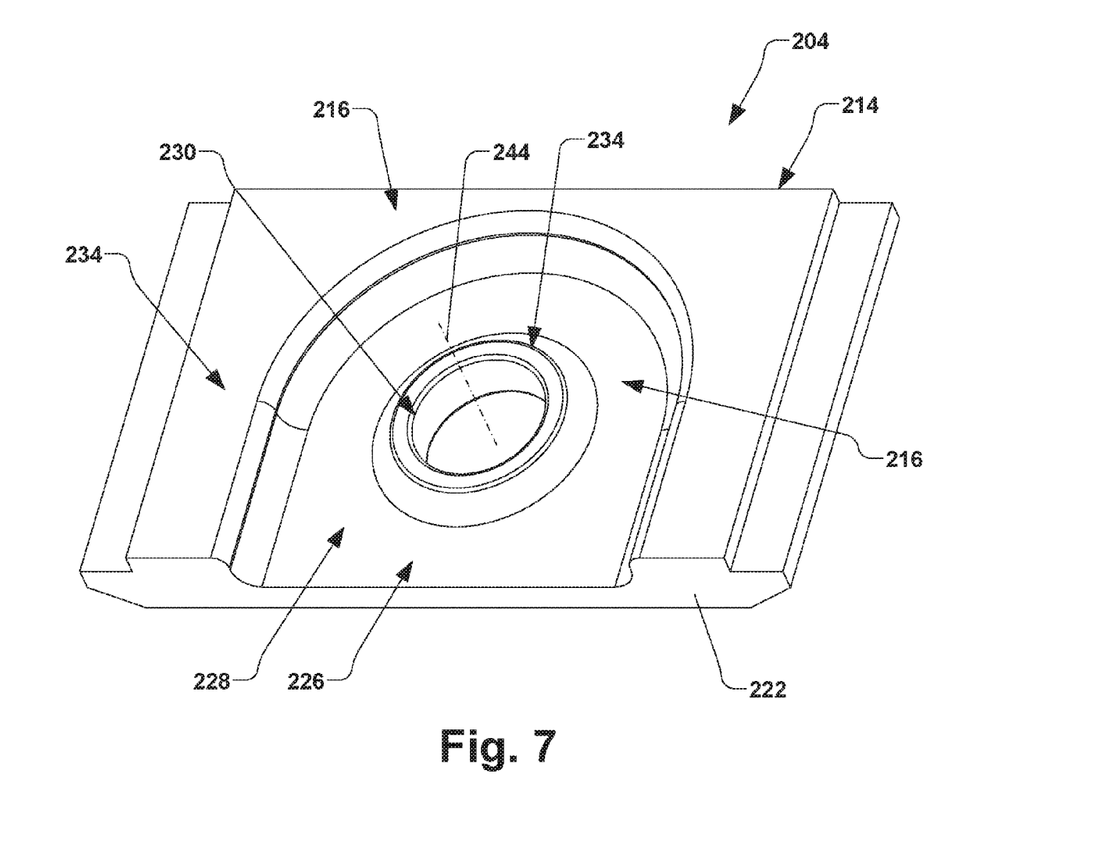
FIG. 7 illustrates a perspective view of an exemplary ion source liner with a raised lip in accordance with several examples of the present disclosure.

In accordance with another example, the lip 234 comprises a third surface 240 that is adjacent to a circumference 242 of the hole 230 of FIG. 8. In one example, the third surface 240 is generally planar, as illustrated in FIG. 9. Further, in accordance with another example, the recess 226, as illustrated in FIG. 7, is generally u-shaped when viewed along an axis 244 of the hole 230.

In accordance with yet another example, wherein the lip 234 has a third diameter 246 associated therewith, as illustrated in FIG. 9. The electrode 208 of FIG. 6, for example, may comprise a repeller 248 (sometimes referred to as the anti-cathode) that is located on the bottom of the arc chamber 202. The repeller 248, for example, has a head 250 exposed to the plasma (not shown) generated within the interior region 212 of the arc chamber 202, wherein the head has a fourth diameter 252, and wherein the fourth diameter is greater than the third diameter 246 of the lip 234 of FIG. 9.

As provided in the example of FIGS. 4-6, the plate 222 defines a bottom surface 246 of the interior region 212 of the arc chamber 202, wherein the lip 234 generally prevents gravity from allowing particulate contaminants 248 from entering the annular gap 206. Accordingly, particulate contaminants 248 that delaminate from the within the arc chamber 202 will generally fall onto the bottom surface 246 due to gravity.

While the repeller 106 may mask line-of-sight to the gap 118 between the electrode and the body 116 of the arc chamber 108 of FIG. 2, small particles of material 114 may eventually make it into the gap. However, the lip 234 of the arc chamber 202 of FIGS. 4-6 generally prevent particulate contaminants 248 from entering the gap 206. Further, the lip 234 of the present disclosure provides a reduction in process gas leakage through the gap 206, as the raised structure of the lip reduces conductance. This highly volatile and typically conductive gas will coat any insulators used in the construction of the arc chamber and shorten their lifetimes.

In another example, while not shown, bottom liner may be a flat plate with the raised lip extending from the first surface around the repeller shaft and may have a similar or different profile as those shown in the Figures. Accordingly, the lip or raised portion on the bottom liner of the arc chamber will prevent small particles of material that flake from the arc chamber liners from entering into the gap between the repeller shaft and the arc chamber body. Flaking of such conductive material may short the biased repeller to the arc chamber body causing an unscheduled maintenance and or plasma instabilities which in turn affect the quality of the ion beam.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion source liner, comprising:
   a plate having an exposure surface configured to be exposed to, and at least partially confine, a plasma generated within an ion source, wherein the exposure surface is defined by a first surface, wherein the plate comprises a hole through the first surface, and wherein the hole is configured to pass an electrode therethrough, leaving an annular gap between the electrode and the hole, and wherein the plate further comprises a lip that surrounds the hole and extends outward from the first surface.

2. The ion source liner of claim 1, wherein the first surface has a recess further defined therein, wherein the recess comprises a second surface that is recessed a first distance from the first surface, and wherein the lip extends a second distance from the second surface toward the first surface.

3. The ion source liner of claim 2, wherein one or more of the first surface and second surface is generally planar.

4. The ion source liner of claim 2, wherein the first distance is approximately twice the second distance.

5. The ion source liner of claim 2, wherein the lip comprises a third surface that is adjacent to a circumference of the hole.

6. The ion source liner of claim 5, wherein the third surface is generally planar.

7. The ion source liner of claim 2, wherein the recess is generally u-shaped when viewed along an axis of the hole.

8. An ion source, comprising:
an arc chamber having a body defining and interior region of the arc chamber;
one or more liners operably coupled to the body of the arc chamber, wherein the one or more liners generally define an exposure surface of the interior region of the arc chamber, and wherein the exposure surface is configured to be exposed to, and at least partially confine, a plasma generated within the interior region of the arc chamber; and
an electrode comprising a shaft having a first diameter, wherein the shaft passes through the body and one of the one or more liners, wherein the electrode is electrically isolated from the body, and wherein said one of the one or more liners comprises a plate having a first surface with a recess having a second surface defined therein, wherein a hole is further defined through the recess and is configured to pass the shaft therethrough, wherein the hole has a second diameter that is larger than the first diameter, therein defining an annular gap between the plate and the shaft, and wherein the plate comprises a lip extending from the second surface toward the first surface, wherein the lip surrounds the hole within the recess and generally prevents particulate contaminants from entering the annular gap.

9. The ion source of claim 8, wherein the second surface is recessed a first distance from the first surface, and wherein the lip extends a second distance from the second surface toward the first surface.

10. The ion source of claim 9, wherein one or more of the first surface and second surface is generally planar.

11. The ion source of claim 9, wherein the first distance is approximately twice the second distance.

12. The ion source of claim 9, wherein the lip comprises a third surface that is adjacent to a circumference of the hole.

13. The ion source of claim 9, wherein the third surface is generally planar.

14. The ion source of claim 9, wherein the recess is generally u-shaped when viewed along an axis of the hole.

15. The ion source of claim 8, wherein the plate defines a bottom surface of the interior region of the arc chamber, and wherein the lip generally prevents gravity from allowing particulate contaminants from entering the annular gap.

16. The ion source of claim 8, wherein the lip has a third diameter associated therewith, wherein the electrode comprises a repeller having a head exposed to the plasma generated within the interior region of the arc chamber, wherein a head has a fourth diameter, and wherein the fourth diameter is greater than the third diameter.

17. An ion source chamber, comprising:
an electrode having a shaft and a head; and
a liner having a hole therethrough, wherein the electrode passes through the hole and defines an annular gap between the shaft and the hole, and wherein the liner comprises a recess with a lip extending from the recess to generally surround the hole and to generally prevent particulate contamination from passing through the hole.

18. The ion source chamber of claim 17, wherein the electrode comprises a repeller apparatus, wherein the repeller apparatus comprises a repeller electrode operably coupled the shaft, and wherein a diameter of the repeller electrode is larger than a diameter of the hole, and wherein a diameter of the shaft is less than the diameter of the hole.

19. The ion source chamber of claim 18, wherein a diameter of the lip is between a diameter of the repeller electrode and the diameter of the hole.

20. The ion source chamber of claim 17, wherein the liner comprises a first surface, wherein the recess comprises a second surface, and wherein the lip extends approximately half way from the first surface toward the second surface.

* * * * *